United States Patent
Chao et al.

(10) Patent No.: US 9,799,639 B2
(45) Date of Patent: Oct. 24, 2017

(54) POWER GATING FOR THREE DIMENSIONAL INTEGRATED CIRCUITS (3DIC)

(71) Applicant: Taiwan Semiconductor Manufacturing Company, Ltd., Hsin-Chu (TW)

(72) Inventors: Chien-Ju Chao, New Taipei (TW); Chou-Kun Lin, Hsin-Chu (TW); Yi-Chuin Tsai, Sing-yan Township (TW); Yen-Hung Lin, Hsin-Chu (TW); Po-Hsiang Huang, Tainan (TW); Kuo-Nan Yang, Hsin-Chu (TW); Chung-Hsing Wang, Baoshan Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/070,904

(22) Filed: Mar. 15, 2016

(65) Prior Publication Data

US 2016/0197068 A1    Jul. 7, 2016

Related U.S. Application Data

(62) Division of application No. 14/470,716, filed on Aug. 27, 2014, now Pat. No. 9,287,257.
(Continued)

(51) Int. Cl.
*H01L 27/02* (2006.01)
*H01L 27/06* (2006.01)
(Continued)

(52) U.S. Cl.
CPC ........ *H01L 27/0207* (2013.01); *H01L 21/768* (2013.01); *H01L 21/8221* (2013.01);
(Continued)

(58) Field of Classification Search
CPC ............................................... H01L 21/823475
See application file for complete search history.

(56) References Cited

U.S. PATENT DOCUMENTS

| 4,902,637 A | 2/1990 | Kondou et al. |
| 5,041,884 A | 8/1991 | Kumamoto et al. |

(Continued)

OTHER PUBLICATIONS

Lee, Y. "Low Temperature Microwave Annealing Process for Future IC Fabrication—A Review" IEEE Transactions on Electron Devices, vol. 61, No. 3, Mar. 2014 pp. 651-665.*
(Continued)

*Primary Examiner* — Matthew Landau
*Assistant Examiner* — Grant Withers
(74) *Attorney, Agent, or Firm* — Slater Matsil, LLP

(57) ABSTRACT

Embodiments of mechanisms for forming power gating cells and virtual power circuits on multiple active device layers are described in the current disclosure. Power gating cells and virtual power circuits are formed on separate active device layers to allow interconnect structure for connecting with the power source be formed on a separate level from the interconnect structure for connecting the power gating cells and the virtual power circuits. Such separation prevents these two types of interconnect structures from competing for the same space. Routings for both types of interconnect structures become easier. As a result, metal lengths of interconnect structures are reduced and the metal widths are increased. Reduced metal lengths and increased metal widths reduce resistance, improves resistance-capacitance
(Continued)

(RC) delay and electrical performance, and improves interconnect reliability, such as reducing electro-migration.

18 Claims, 11 Drawing Sheets

Related U.S. Application Data

(60) Provisional application No. 62/005,801, filed on May 30, 2014.

(51) Int. Cl.

| | |
|---|---|
| *H01L 23/528* | (2006.01) |
| *H01L 23/50* | (2006.01) |
| *H01L 21/768* | (2006.01) |
| *H01L 21/8234* | (2006.01) |
| *H01L 21/822* | (2006.01) |
| *H01L 21/8238* | (2006.01) |
| *H01L 27/092* | (2006.01) |
| *H01L 21/324* | (2006.01) |
| *H01L 23/532* | (2006.01) |

(52) U.S. Cl.
CPC .......... *H01L 21/823475* (2013.01); *H01L 21/823871* (2013.01); *H01L 23/50* (2013.01); *H01L 23/528* (2013.01); *H01L 23/5283* (2013.01); *H01L 23/5286* (2013.01); *H01L 23/5329* (2013.01); *H01L 27/0203* (2013.01); *H01L 27/0688* (2013.01); *H01L 27/092* (2013.01); *H01L 21/324* (2013.01); *H01L 23/53238* (2013.01); *H01L 2924/0002* (2013.01)

(56) References Cited

U.S. PATENT DOCUMENTS

| | | | |
|---|---|---|---|
| 5,675,185 A | 10/1997 | Chen et al. | |
| 5,888,872 A | 3/1999 | Gardner et al. | |
| 6,191,442 B1 | 2/2001 | Matsufusa | |
| 6,351,364 B1 | 2/2002 | Chen et al. | |
| 6,392,253 B1 | 5/2002 | Saxena | |
| 6,414,830 B1 | 7/2002 | Yu | |
| 6,809,538 B1 | 10/2004 | Borkar | |
| 6,821,826 B1 | 11/2004 | Chan et al. | |
| 8,058,137 B1* | 11/2011 | Or-Bach ............... H03K 17/687 257/E21.023 | |
| 8,242,570 B2 | 8/2012 | Chang et al. | |
| 8,530,931 B2 | 9/2013 | Asano et al. | |
| 8,633,562 B2 | 1/2014 | Gu et al. | |
| 8,686,428 B1 | 4/2014 | Sekar et al. | |
| 8,930,875 B2 | 1/2015 | Yin | |
| 8,987,786 B1 | 3/2015 | Tan et al. | |
| 2002/0025604 A1 | 2/2002 | Tiwari | |
| 2003/0016479 A1 | 1/2003 | Song | |
| 2003/0068871 A1 | 4/2003 | Chan et al. | |
| 2004/0080999 A1 | 4/2004 | Madurawe | |
| 2005/0138588 A1 | 6/2005 | Frenkil | |
| 2006/0065962 A1 | 3/2006 | Narendra et al. | |
| 2006/0114025 A1 | 6/2006 | Frenkil et al. | |
| 2007/0132030 A1 | 6/2007 | Chen | |
| 2007/0215906 A1 | 9/2007 | Wu et al. | |
| 2008/0087962 A1 | 4/2008 | Salman et al. | |
| 2008/0191247 A1 | 8/2008 | Yin et al. | |
| 2008/0191312 A1 | 8/2008 | Oh et al. | |
| 2008/0237718 A1 | 10/2008 | Noveski et al. | |
| 2008/0283873 A1 | 11/2008 | Yang et al. | |
| 2008/0288720 A1 | 11/2008 | Atwal et al. | |
| 2009/0065941 A1 | 3/2009 | La Tulipe, Jr. et al. | |
| 2009/0068835 A1 | 3/2009 | La Tulipe, Jr. et al. | |
| 2009/0160012 A1 | 6/2009 | Kim | |
| 2009/0168482 A1 | 7/2009 | Park et al. | |
| 2009/0184264 A1 | 7/2009 | Chen et al. | |
| 2009/0185407 A1 | 7/2009 | Park et al. | |
| 2009/0278251 A1 | 11/2009 | Tsia et al. | |
| 2009/0283829 A1 | 11/2009 | Dyer et al. | |
| 2009/0325343 A1* | 12/2009 | Lee ..................... H01L 21/2007 438/107 | |
| 2010/0005437 A1 | 1/2010 | McIlrath | |
| 2010/0032641 A1 | 2/2010 | Mikawa et al. | |
| 2010/0035393 A1 | 2/2010 | Aitken et al. | |
| 2010/0081233 A1 | 4/2010 | Lee | |
| 2010/0155932 A1 | 6/2010 | Gambino et al. | |
| 2010/0252934 A1 | 10/2010 | Law et al. | |
| 2010/0295136 A1 | 11/2010 | Or-Bach et al. | |
| 2010/0308471 A1 | 12/2010 | Korogi et al. | |
| 2011/0053332 A1 | 3/2011 | Lee | |
| 2011/0267880 A1 | 11/2011 | Swei et al. | |
| 2012/0049259 A1 | 3/2012 | Kim | |
| 2012/0107967 A1* | 5/2012 | Or-Bach ............... H03K 17/687 438/4 | |
| 2013/0033632 A1 | 2/2013 | Kishi | |
| 2013/0043554 A1* | 2/2013 | Piper .................. H01L 27/0688 257/506 | |
| 2013/0082235 A1* | 4/2013 | Gu ....................... H01L 21/8258 257/9 | |
| 2013/0178048 A1 | 7/2013 | Sun et al. | |
| 2013/0258746 A1 | 10/2013 | Kurokawa | |
| 2013/0307160 A1 | 11/2013 | Farooq et al. | |
| 2014/0043093 A1 | 2/2014 | Yamazaki et al. | |
| 2014/0043902 A1 | 2/2014 | Unno | |
| 2014/0225235 A1 | 8/2014 | Du | |
| 2014/0252306 A1 | 9/2014 | Du | |
| 2014/0319648 A1 | 10/2014 | Fenouillet-Beranger et al. | |
| 2015/0084158 A1 | 3/2015 | Tsai et al. | |
| 2015/0091130 A1 | 4/2015 | Yang | |
| 2015/0102419 A1 | 4/2015 | Ikeda et al. | |
| 2015/0162259 A1 | 6/2015 | Bartley et al. | |
| 2015/0179568 A1 | 6/2015 | Chang et al. | |
| 2015/0214221 A1 | 7/2015 | Huang et al. | |
| 2015/0221636 A1 | 8/2015 | Chen et al. | |
| 2015/0270257 A1 | 9/2015 | Edwards et al. | |
| 2015/0287692 A1 | 10/2015 | Enquist et al. | |

OTHER PUBLICATIONS

Wang et al. "Power Gating Topologies in TSV Based 3D Integrated Circuits" GLSVLSI' 13 May 3, 2013 pp. 327-328.
Wang et al., "Enhancing System-Wide Power Integrity in 3D ICs with Power Gating" 16th ISQED Mar. 4, 2015 pp. 322-326.

* cited by examiner

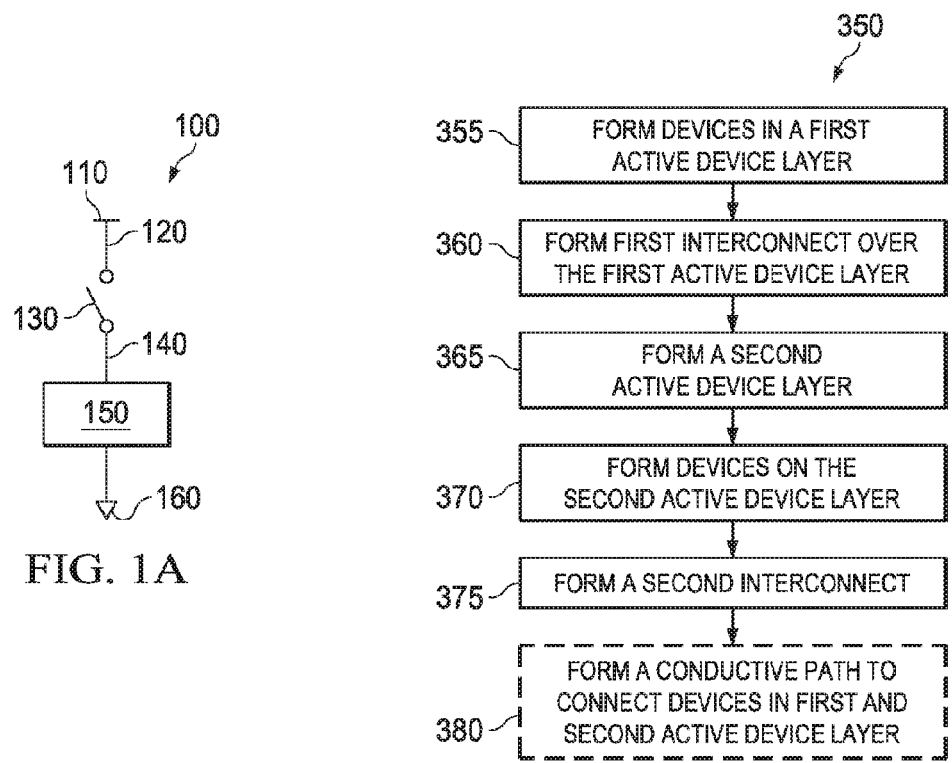
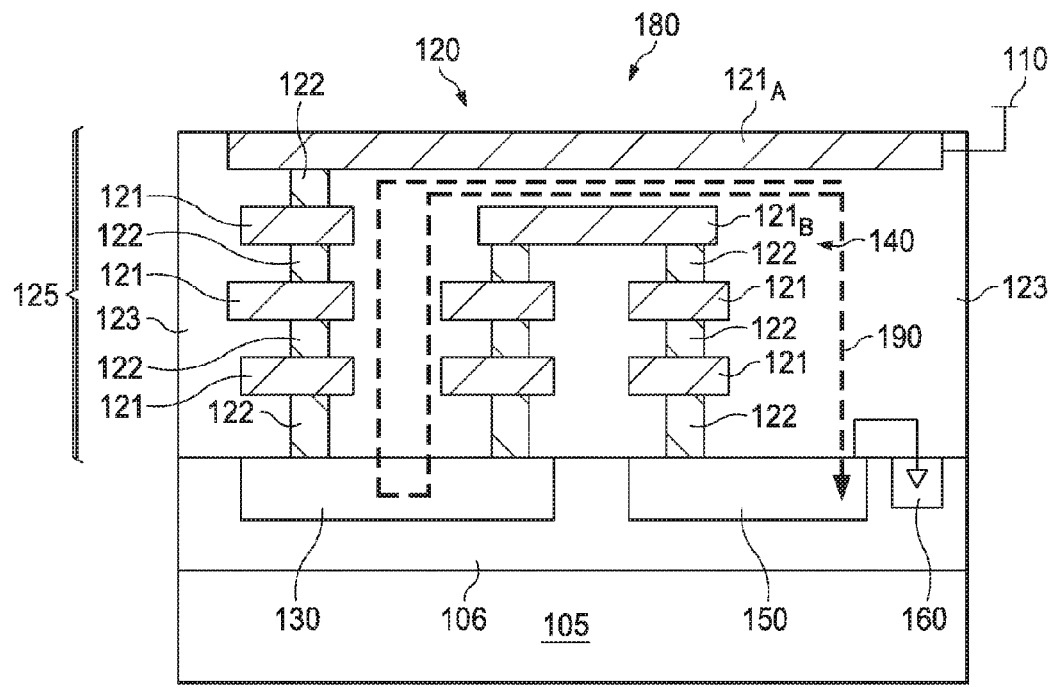

US 9,799,639 B2

POWER GATING FOR THREE DIMENSIONAL INTEGRATED CIRCUITS (3DIC)

PRIORITY CLAIM

This application is a divisional of U.S. patent application Ser. No. 14/470,716, filed on Aug. 27, 2014, entitled "Power Gating For Three Dimensional Integrated Circuits (3DIC)" which claims priority to U.S. Provisional Patent Application No. 62/005,801, filed May 30, 2014, and entitled "POWER GATING FOR THREE DIMENSIONAL INTEGRATED CIRCUITS (3DIC)," which applications are incorporated herein by reference.

BACKGROUND

Integrated circuits have experienced continuous rapid growth due to constant improvements in an integration density of various electronic components (i.e., transistors, diodes, resistors, capacitors, etc.). For the most part, this improvement in integration density has come from repeated reduction in minimum feature size, allowing more components to be integrated into a given chip area.

The area occupied by the integrated components is near the surface of the semiconductor wafer. Although dramatic improvements in lithography have resulted in considerable improvement in two-dimensional (2D) integrated circuit formation, there are physical limitations to an achievable density in two dimensions. One of these limitations is the minimum size needed to make the integrated components. Further, when more devices are put into one chip, more complex designs are required. An additional limitation comes from the significant gains in the number and length of interconnections between devices as the number of devices increases. When the number and length of interconnections increase, both circuit RC delay and power consumption increase.

Three-dimensional integrated circuits (3DICs) were thus proposed, wherein dies or active layers are stacked, with various bonding schemes being used to stack the dies or active layers together and to connect the dies to package substrates. There is continuous effort in developing new mechanisms of forming 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A shows a schematic diagram of a circuit, in accordance with some embodiments.

FIG. 1B shows a cross-sectional view of a device region of the circuit in FIG. 1A, in accordance with some embodiments.

FIG. 3B depicts a process for forming a three dimensional integrated circuit structure of FIG. 3A according to one or more embodiments, and FIGS. 6A-6E schematically illustrated the steps of the process.

DETAILED DESCRIPTION

Figure 2:
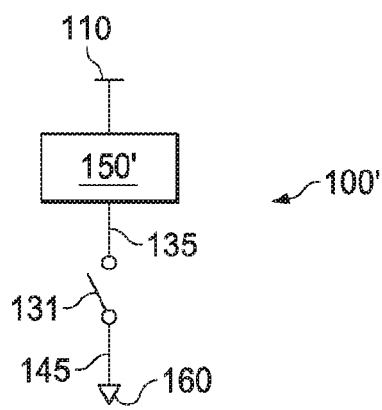
FIG. 2 shows a schematic diagram of a circuit with a power gate cell (PGC) being an n-type MOSFET, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Monolithic 3DIC is a new mechanism for increasing device density. Multiple active layers are formed in the same die with intervening interconnect layers. Monolithic 3DIC enables forming devices in multiple active device layers. One aspect of the disclosure relates to three dimensional integrated circuits (3DICs), and in particular to, 3DIC power gating structures. Various embodiments of structures are provided to utilize the benefit of a monolithic 3DIC structure for generating power gating configurations that allow for distribution of virtual supply power and increase integrated circuit routing resources and chip performance.

Power gating cells are used to control the distribution of powers for circuits and become popular for low power devices. Using power gating cells enables devices to be turned off when they are used to reduce leakage and power consumption. FIG. 1A shows a schematic diagram of a circuit 100 with a power gate cell (PGC) 130 between true power source (TV$_{DD}$) 110 and a virtual power (VV$_{DD}$) circuit 150 powered by the power supply, in accordance with some embodiments. The term true power source (TV$_{DD}$) is used to contrast virtual power source (VV$_{DD}$), which is described below. FIG. 1A shows true power source (TV$_{DD}$) 110 is connected to the PGC 130 through a true power (TV$_{DD}$) interconnect 120, which is connected to TV$_{DD}$ (not VV$_{DD}$) 110. FIG. 1A also shows that PGC 130 is connected to a virtual power (VV$_{DD}$) circuit 150 through a virtual power (VV$_{DD}$) interconnect 140. Power-gating signal switches the PGC 130 to turn on or turn off the virtual power source $VV_{DD}$. When the PGC 130 is on, the $TV_{DD}$ pass the PGC 130 to $VV_{DD}$. When the PGC 130 is off, the $VV_{DD}$ almost equal zero. Circuit 150 and interconnect 140 are connected to PGC 130. As a result, they are called circuit supplied by virtual power ($VV_{DD}$) 150 and virtual power ($VV_{DD}$) interconnect 140 respectively. FIG. 1A also shows that $VV_{DD}$ circuit 150 is connected to a ground 160. In some embodiments, the PGC 130 is a p-type metal-oxide-semiconductor field-effect transistor (MOSFET).

FIG. 1B shows a cross-sectional view of a device region 180 of circuit 100 in FIG. 1A, in accordance with some embodiments. Device region 180 includes a substrate 105, which has an active device layer 106. Substrate 105 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, where the substrate 105 is an alloy semiconductor; the alloy semiconductor substrate has a gradient SiGe feature in which the Si and Ge composition change from one ratio at one location to another ratio at another location of the gradient SiGe feature. In some embodiments, the alloy SiGe is formed over a silicon substrate, and/or the SiGe substrate is strained. In yet another alternative, the semiconductor substrate is a semiconductor on insulator (SOI).

Active device layer 106 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, where the substrate 105 is an alloy semiconductor; the alloy semiconductor substrate has a gradient SiGe feature in which the Si and Ge composition change from one ratio at one location to another ratio at another location of the gradient SiGe feature.

Active device layer 106 includes various doped regions depending on design requirements as known in the art (e.g., p-type wells or n-type wells). The doped regions are doped with p-type dopants, such as boron or $BF_2$, and/or n-type dopants, such as phosphorus or arsenic. In some embodiments, the doped regions are formed directly on the substrate 105 (and active device layer 106 is part of substrate 105), in a P-well structure, in an N-well structure, in a dual-well structure, or using a raised structure. The doped regions include various active regions, such as regions configured for an N-type metal-oxide-semiconductor transistor (referred to as an NMOS) and regions configured for a P-type metal-oxide-semiconductor transistor (referred to as a PMOS).

PGC 130 and $VV_{DD}$ circuit 150 are formed in active device layer 106. The gate structures of PGC 130 and $VV_{DD}$ circuit 150 could extend above the surface of the active device layer 106. In some embodiments, PGC 130 is a p-type metal-oxide-semiconductor (PMOS) field effect transistor (PMOSFET). $VV_{DD}$ circuit 150 could include one or more devices whose power is supplied when PGC 130 is turned on. The devices in circuit 150 are interconnected; however, the interconnection for $VV_{DD}$ circuit 150 is not shown in FIG. 1B. FIG. 1B shows an interconnect structure 125 formed over active device layer 106. The interconnect structure 125 includes multiple layers of metal lines 121 and connecting vias/contacts 122. Vias provide conductive paths between metal layers. Contacts provide conductive paths between conductive regions devices, such as gate structures and source/drain regions, and first metal layer. The metal line 121 and the connecting vias/contacts 122 include conductive material(s) with low resistivity, such as Cu, Al, W, etc. Other applicable materials may also be used. A barrier layer could be formed prior to depositing the conductive material(s). For example, if the conductive material includes Cu, which is diffusive in silicon-containing dielectric materials, a Ta and TaN could be formed to prevent Cu from diffusing into the surrounding silicon-containing dielectric material(s).

The metal lines 121 and vias 122 are insulated dielectric material 123, which may be made of one or more dielectric materials and could include one or more layers. In some embodiments, dielectric material 123 includes a low dielectric constant (low-k) dielectric material and has a dielectric constant (k value) lower than about 3.5. In some embodiment, the k value of dielectric material 123 is equal to or lower than about 2.5. Suitable materials for the low-k dielectric material may include, but are not limited to, doped silicon dioxide, fluorinated silica glass (FSG), carbon-doped silicon dioxide, porous silicon dioxide, porous carbon-doped silicon dioxide, SiLK™ (an organic polymeric dielectric distributed by Dow Chemical of Michigan), Black Diamond (a product of Applied Materials of Santa Clara, Calif.), Xerogel, Aerogel, amorphous fluorinated carbon, Parylene, bis-benxocyclocutenes (BCB), polyimide, polynoroboneses, benzocyclocutene, PTFE, porous SiLK, hydrogen silsesquioxane (HSQ), methylsilsesquioxane (MSQ), and/or combinations thereof. The low-k dielectric material may be deposited by a chemical vapor deposition (CVD), plasma enhanced CVD (PECVD), or spin-on process.

The low-k dielectric could also be an extreme low-k dielectric (ELK). The ELK material may have a dielectric constant of less than about 2.5. Exemplary ELK materials include porous low-k materials. In some embodiments, the ELK is a silicon oxide based low-k material having a porous structure, which is adapted to a porogen-doped SiCO-based material by incorporating a porogen (or a porogen material) into a carbon-doped oxide dielectric. Other materials may also be used.

As shown in FIG. 1B, PGC 130 is connected to $TV_{DD}$ 110 through $TV_{DD}$ interconnect 120, which includes a number of layers of metal lines 121 (including metal line $121_A$) and vias/contact 122. FIG. 1B also shows that PGC 130 is also connected to $VV_{DD}$ circuit 150 through $VV_{DD}$ interconnect 140, which also include a number of layers of metal lines 121 (including metal line $121_B$) and vias 122. $VV_{DD}$ circuit 150 is connected to ground 160. $TV_{DD}$ interconnect 120 and $VV_{DD}$ interconnect 140 are in the vicinity of each other, as shown in FIG. 1B. The dotted line 190 along metal line 121A and following interconnect structure 125 to PGC 130 and then to $VV_{DD}$ circuit 150 through interconnect 140 (including metal line $121_B$) illustrates the current flow.

FIG. 1B illustrates four metal layers and four corresponding via/contact levels. However, they are merely drawn and described as examples. More or fewer metal and via/contact layers could be involved. In addition, the metal line $121_A$ and $121_B$ could be at the same level, in some embodiments.

In a device die, there are many power gating cells (PGCs) 130 used to control the power supply to various circuits. These PGCs 130 all need $TV_{DD}$ interconnects 120 to connect them to $TV_{DD}$ 110. The numerous $TV_{DD}$ interconnects 120 require routing and look like mesh from a top view. As a results, $TV_{DD}$ interconnects 120 are also described as $TV_{DD}$ power mesh. Similarly, $VV_{DD}$ interconnects 140 between PGCs 130 and $VV_{DD}$ circuit 150 also require routing and also look like mesh from a top view. Therefore, $VV_{DD}$ interconnects 140 are also described as $VV_{DD}$ power mesh. As mentioned above, $TV_{DD}$ interconnects 120 are in the vicinity of their corresponding $VV_{DD}$ interconnects 140. The intertwining $TV_{DD}$ interconnects 120 and $VV_{DD}$ interconnects 140 crowd one another and make routing challenging. The routing results in increase in metal lengths, which increase metal line resistance also increase the IR drop. The crowding of $TV_{DD}$ interconnects 120 and $VV_{DD}$ interconnects 140 limits the allowable widths of metal lines of $TV_{DD}$ interconnects 120 and $VV_{DD}$ interconnects 140. Narrower metal widths also increase metal line resistance.

As mentioned above, the power gate cell (PGC) 130 in circuit 100 is a p-type MOSFET. FIG. 2 shows a schematic diagram of a circuit 100' with a power gate cell (PGC) 131 being an n-type MOSFET, in accordance with some embodiments. The PGC 131 is connected to ground 160 through a true ground ($TV_{SS}$) interconnect 145. The PGC 131 is also connected to virtual ground ($VV_{SS}$) interconnect 135, which is connected to virtual supply ($VV_{SS}$) circuit 150'. The description of FIG. 2 is provided to demonstrate that the embodiments described apply to both p-type and n-type PGC. Circuit 100' also experiences similar routing challenges as the circuit 100.

As mentioned above, monolithic 3DIC is a new device structure for increasing device density with multiple active device layers being formed in the same die with intervening interconnect layers. Monolithic 3DIC enables forming devices in multiple active device layers. In some embodiments, a 3DIC structure provides a power gate cell on an active layer and the circuit supplied by virtual supply on another active layer. Such arrangement allows the $TV_{DD}$ power mesh to be at different interconnect structure (layer) as the $VV_{DD}$ power mesh. According to some embodiments, power gating cells can be placed in an active layer or in multiple layers that are closer to power supply sources. In some other embodiments, a circuit powered by true supply voltage may be placed on the same active layers as the power gating cells to save area. The distribution of true supply may be on backend layers between a power gating cell and a source of supply or distribution parallel with the backend layers between a power gating cell and the true supply circuit to reduce the voltage drop of true power. The distribution of virtual supply may be in backend layers between the power gating cell and the virtual supply circuit.

According to one embodiment, power gating cells and virtual supply powered circuits may be separated to different active layers to reduce the penalty associated with n-well separation. According to another embodiment, non-overlapping power mesh may be used for true (e.g., always-on)/virtual supplies to use the routing resource more effectively.

According to one embodiment, power gating cells and true supply powered circuits may be put in same active layers due to in this embodiment, the power supplied from same source is not require the extra n-well spacing.

The embodiments described may also be applied to other types of three dimensional integrated circuits (3DICs) where dies may be stacked with wire-bonding, flip-chip bonding, and/or through-silicon vias (TSV) used to connect the dies together and to connect the dies to package substrates.

Figure 3A:
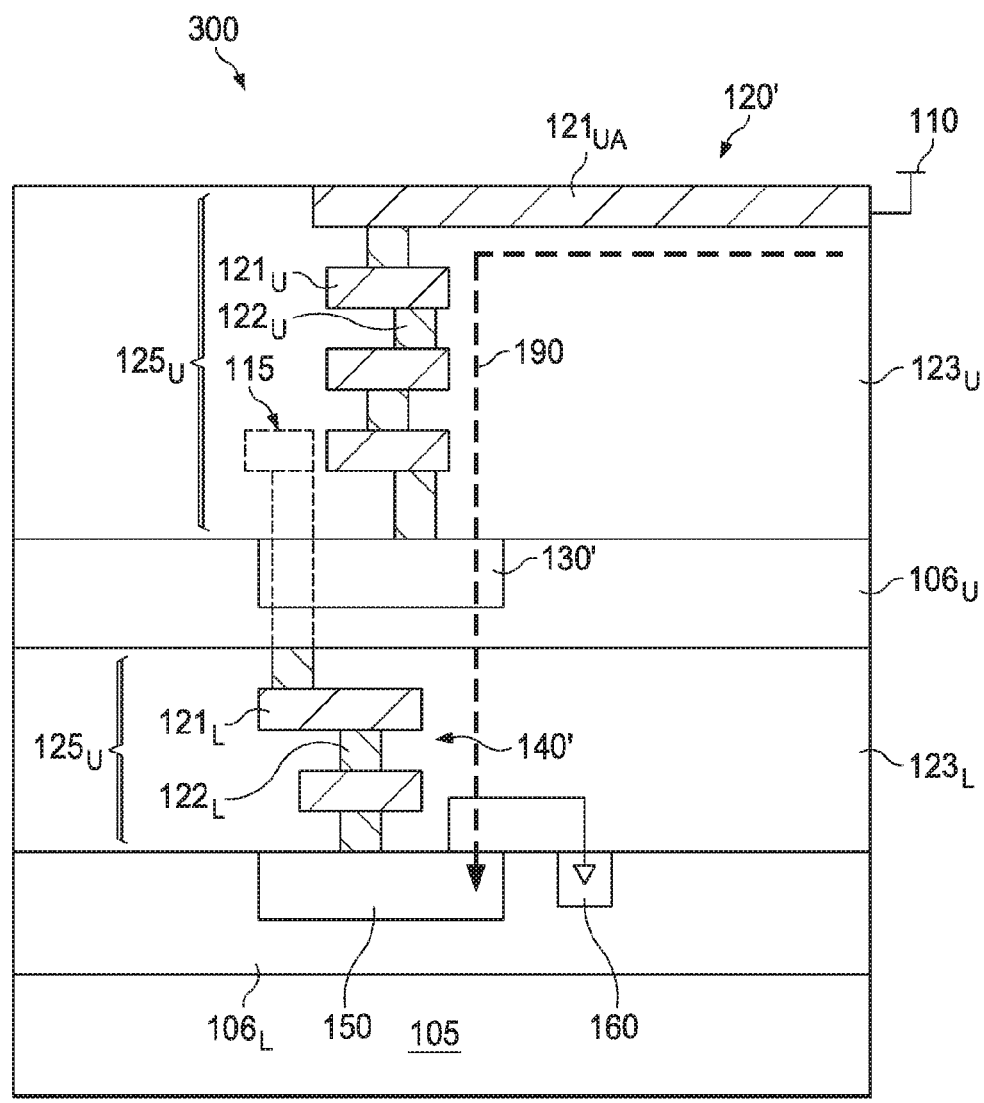
FIG. 3A depicts a graphical representation of a three dimensional integrated circuit (3DIC) structure according to one or more embodiments.

FIG. 3A depicts a graphical representation of a three dimensional integrated circuit (3DIC) structure 300 according to one or more embodiments. According to one embodiment, 3DIC structure 300 includes power gating cell (PGC) 130' which receives power from a true power source ($TV_{DD}$) 110 through a true power ($TV_{DD}$) interconnect 120'. $TV_{DD}$ 110 has been described above. PGC 130' is similar to PGC 130 and is formed in an upper active device layer $106_U$, which in turn is formed over a lower interconnect structure $125_L$. True power interconnect (or $TV_{DD}$ interconnect) 120' is similar to the true power interconnect 120 described in FIGS. 1A and 1B and is part of an upper interconnect structure $125_U$, which is formed over upper active device layer $106_U$. The upper active device layer $106_U$ is similar to active device layer 106, described above. The upper interconnect structure $125_U$ is similar to interconnect structure 125 described in FIG. 1B and includes multiple layers of upper metal lines $121_U$ and upper connecting vias/contacts $122_U$. The upper metal lines $121_U$ and upper vias $122_U$ are insulated by dielectric material $123_U$. $TV_{DD}$ interconnect 120' also includes a number of layers of upper metal lines $121_U$ (including metal line $121_{UA}$) and upper vias/contact $122_U$.

PGC 130' is connected to virtual power ($VV_{DD}$) circuit 150 through virtual power ($VV_{DD}$) interconnect 140', as shown in FIG. 3A in accordance with some embodiments. A conductive path 115 is formed between PGC 130' and $VV_{DD}$ interconnect 140' to provide electrical connection in some embodiments. The conductive path 115 (dotted-line interconnect structure) has low resistance to form low resistance ohmic contact between PGC 130' and interconnect $125_L$. In some embodiments, the conductive path 115 is made of metal material(s) and could go through $106_U$. The conductive path 115 could also connect with the front side of PGC 130' and extend upward to include part of or all layers of interconnect $125_U$. Virtual power interconnect (or $VV_{DD}$ interconnect) 140' is similar to the true power interconnect 140 described in FIGS. 1A and 1B and is part of a lower interconnect structure $125_L$, which is formed over lower active device layer $106_L$. Lower active device layer $106_L$ is similar to active device layer 106 described above and is formed over a substrate 105. The lower interconnect structure $125_L$ is similar to interconnect structure 125 described in FIG. 1B and includes multiple layers of lower metal lines $121_L$ and lower connecting vias/contacts $122_L$. The lower metal lines $121_L$ and lower vias $122_L$ are insulated by dielectric material $123_L$. $VV_{DD}$ interconnect 140' also includes a number of layers of lower metal lines $121_L$ (including metal line $121_{LB}$) and lower vias/contact $122_L$.

The dotted line 190 along metal line $121_{UA}$ and following interconnect structure $125_U$ to PGC 130 and then to $VV_{DD}$ circuit 150 through interconnect structure $125_L$ illustrates the current flow. $VV_{DD}$ circuit 150 is connected to a ground 160, as shown in FIG. 3A.

As mentioned above, there are many power gating cells (PGCs), (such as 130 or 130') used to control the power supply to various circuits in a device die. The PGCs, 130 or 130', all need $TV_{DD}$ interconnects, 120 or 120', to connect them to $TV_{DD}$ 110. The numerous $TV_{DD}$ interconnects, 120 or 120', require routing resource. Similarly, the numerous $VV_{DD}$ interconnects, 140 or 140', also requires routing. By forming PGC 130' at a separate active device level from virtual power ($VV_{DD}$) circuit 150, this allows $TV_{DD}$ interconnect 120' to be formed in a separate interconnect structure, formed in $125_U$, from the $VV_{DD}$ interconnect 140', which is formed in $125_L$. As a result, there is more space to place $TV_{DD}$ interconnect 120' and $VV_{DD}$ interconnect 140' in their respective interconnect levels in comparison to $TV_{DD}$ interconnect 120 and $VV_{DD}$ interconnect 140 of FIG. 1B. $TV_{DD}$ interconnect 120 and $VV_{DD}$ interconnect 140 of FIG. 1B compete for space in the same interconnect level.

As mentioned above, the intertwining $TV_{DD}$ interconnects 120 and $VV_{DD}$ interconnects 140 crowd one another and make routing challenging. The routing results in an increase in metal lengths, which increases metal line resistance. The crowding of $TV_{DD}$ interconnects 120 and $VV_{DD}$ interconnects 140 also limits the allowable widths of metal lines of $TV_{DD}$ interconnects 120 and $VV_{DD}$ interconnects 140. Narrower metal widths also increase metal line resistance. By placing $TV_{DD}$ interconnect 120' and $VV_{DD}$ interconnect 140' in their respective interconnect levels, the above-mentioned issues no longer exist. For example, the connection between PGC 130' and virtual power ($VV_{DD}$) circuit 150 can take a short path (or direct path) without going up to a higher metal level and then extending laterally on the higher metal level before being connected to the virtual power ($VV_{DD}$) circuit 150, as shown in FIG. 1B. Direct connection with shorter path would reduce interconnect resistance, which reduces resistance-capacitance (RC) delay and improve chip performance.

As a result, the routing becomes easier, the current flow path lengths for both $TV_{DD}$ interconnect 120' and $VV_{DD}$ interconnect 140' are reduced. In addition, the metal widths for $TV_{DD}$ interconnect 120' and $VV_{DD}$ interconnect 140' could be increased due to the extra space available. Reduced current flow path lengths and increased metal widths reduce resistance, improves resistance-capacitance (RC) delay and electrical performance, and improves interconnect reliability.

Upper active layer $106_U$ is formed after the devices are formed in the lower active layer $106_L$ and also after the lower interconnect $125_L$ are formed. As a result, processing temperatures and/or conditions of processes used to form upper active layer $106_U$, PGC 130' and upper interconnect $125_U$ need to be carefully considered. Lower interconnect $125_L$ includes metal layers, which if formed of metal materials, such as Al or Cu, could deform or become unstable at some temperature, such as 450° C. or higher. In addition, the dopants in the devices formed in the lower active layer $106_L$ could diffuse under high processing temperatures, such as greater than about 700° C. to about 800° C. Forming devices, such as transistors or memories, would likely require some annealing processes. Forming devices, such as PGC 130', in the upper active layer $106_U$ would require processing temperatures and conditions compatible with lower interconnect $125_L$. If a high processing temperature is needed, the duration would need to be kept short. For example, micro-second anneal or laser anneal can be used for its short processing duration. Microwave anneal (MWA) may also be considered because it enables defect removal at a much lower temperature(s), such as in a range from about 400° C. to about 600° C., than other rapid thermal processing tools. Detailed examples of microwave anneal processes are described in U.S. patent application Ser. No. 14/250,217, entitled "Microwave Anneal (MWA) for Defect Recovery," filed on Apr. 10, 2014, which is incorporated herein by reference in its entirety.

Figure 6A:
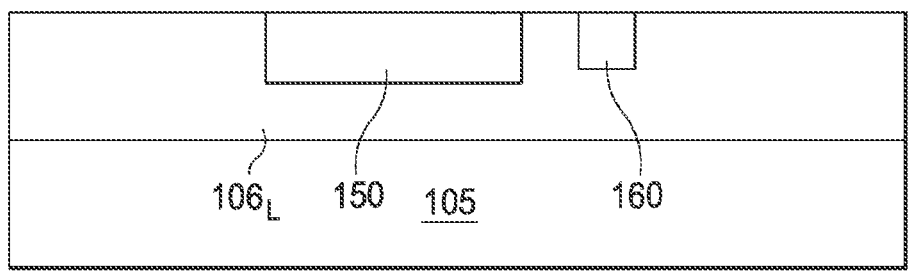
Figure 6B:
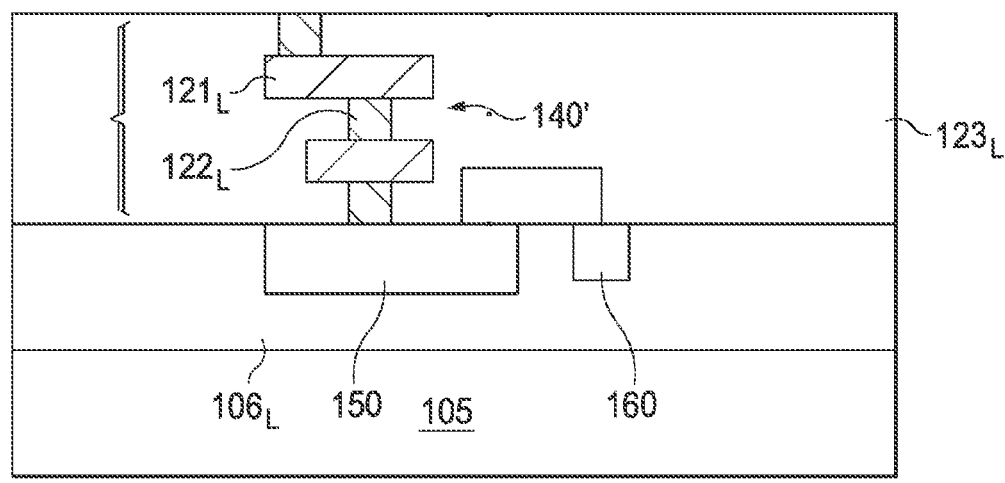
Figure 6C:
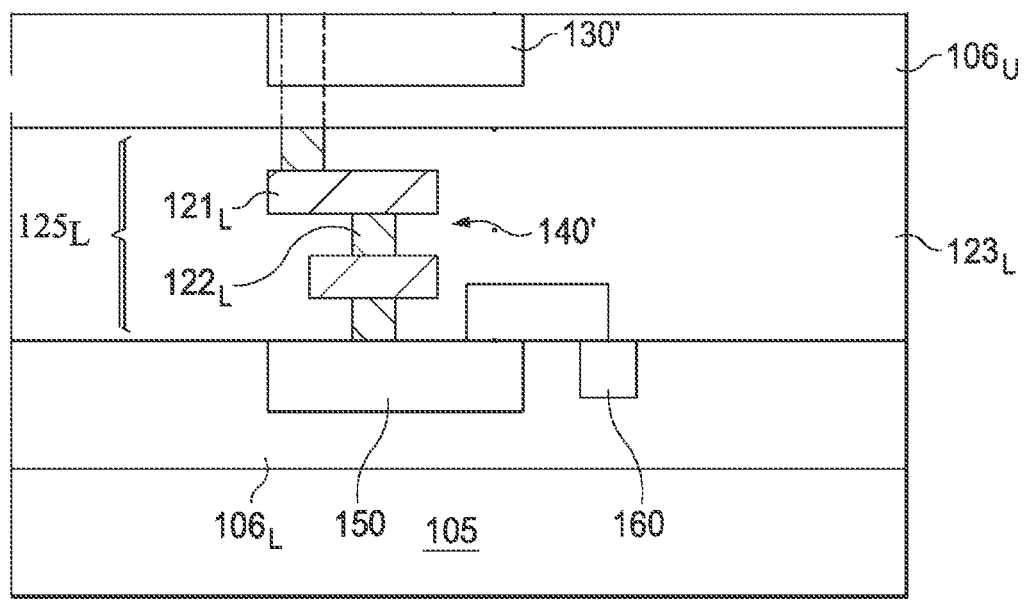
Figure 6D:
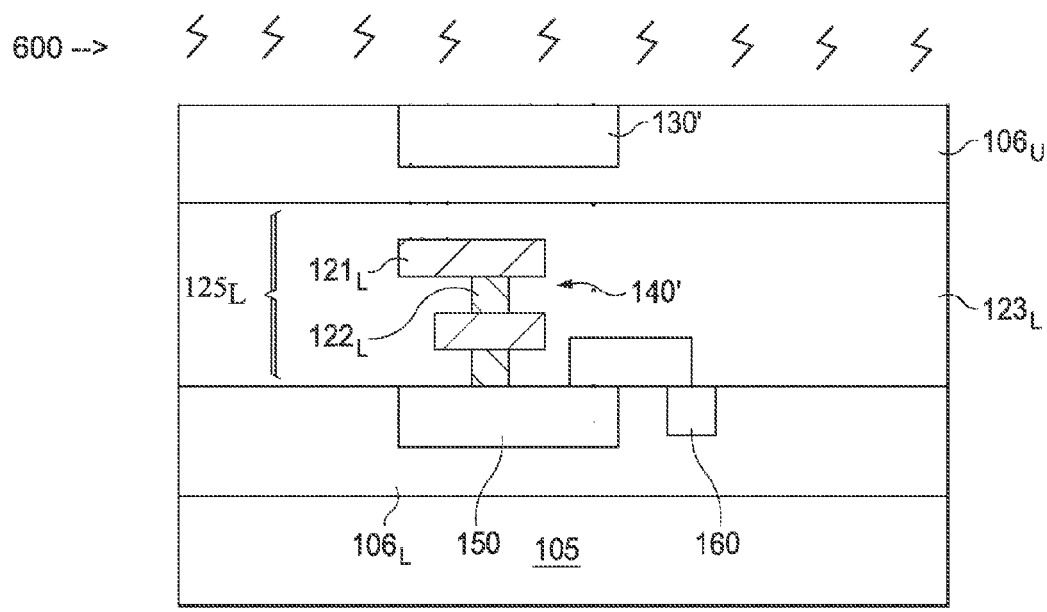
Figure 6E:
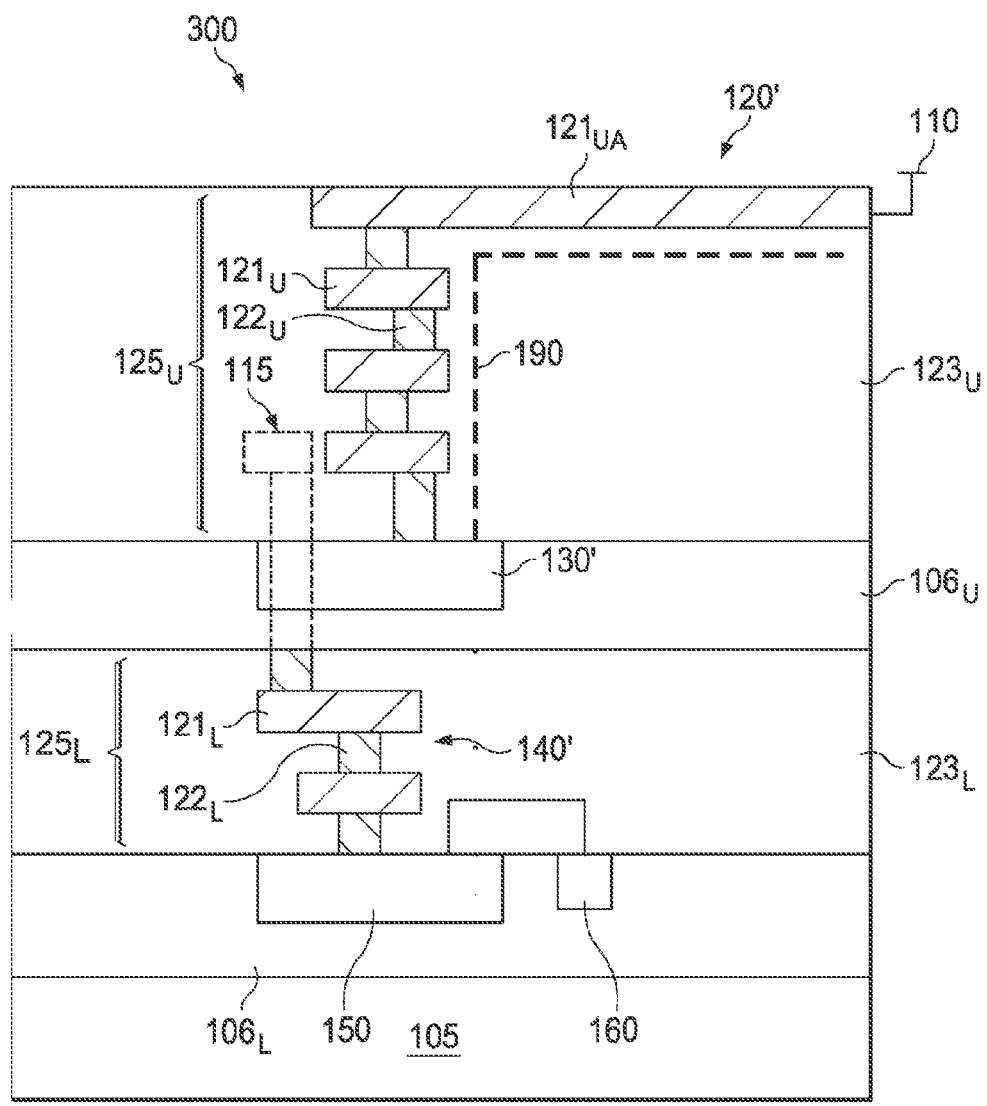

FIG. 3B depicts a process for forming a three dimensional integrated circuit structure of FIG. 3A according to one or more embodiments. According to one embodiment, process 350 for forming a 3DIC starts with forming devices ($VV_{DD}$ circuit 150) in a first active device layer ($106_L$) on a substrate at operation 355. The devices formed include virtual power circuits (such as circuit 150). The devices formed may also include true power circuits, and/or power gating cell(s), which are not shown in FIG. 3A. FIG. 6A illustrates the process step. Afterwards, first interconnect ($125_L$) are formed over the first active device layer ($106_L$) at operation 360, as illustrated schematically in FIG. 6B. A second active device layer ($106_U$) is then formed over the first interconnect at operation 365, and as shown in FIG. 6C. Devices are subsequently formed in the second active device layer ($106_U$) at operation 370. The devices formed include power gating cell 130' as also shown in FIG. 6C. As discussed further below, an upper, or second, active device layer may be annealed in the manufacturing process, such as schematically illustrated by anneal process 600 in FIG. 6D. However, virtual power circuits and true power circuits, which are not shown in FIG. 3A, may also be formed. Afterwards, second interconnect ($125_U$) are formed over the second active device layer ($106_U$) at operation 375, as schematically illustrated in FIG. 6E. In some embodiments, true power source (no) is connected to the second interconnect ($125_U$). The second interconnect ($125_U$) is in direct contact with a power gating cell (130'). The power from the true power source (110) is supplied to the power gating cell (130') in the second active device layer ($106_U$), which is electrically connected to the first interconnect ($125_U$). During the formation of the second interconnect ($125_U$), a conductive path (115) is formed to electrically connect the power gating cell (130') in the second active device layer to the first interconnect ($125_L$). In some embodiments, the conductive path (115) is formed after the second interconnect ($125_U$) is formed at operation 380. A conductive path could be formed through the dielectric layer(s) of the second interconnect ($125_U$) to connect the power gating cell (130') to the first interconnect ($125_L$).

Figure 4:
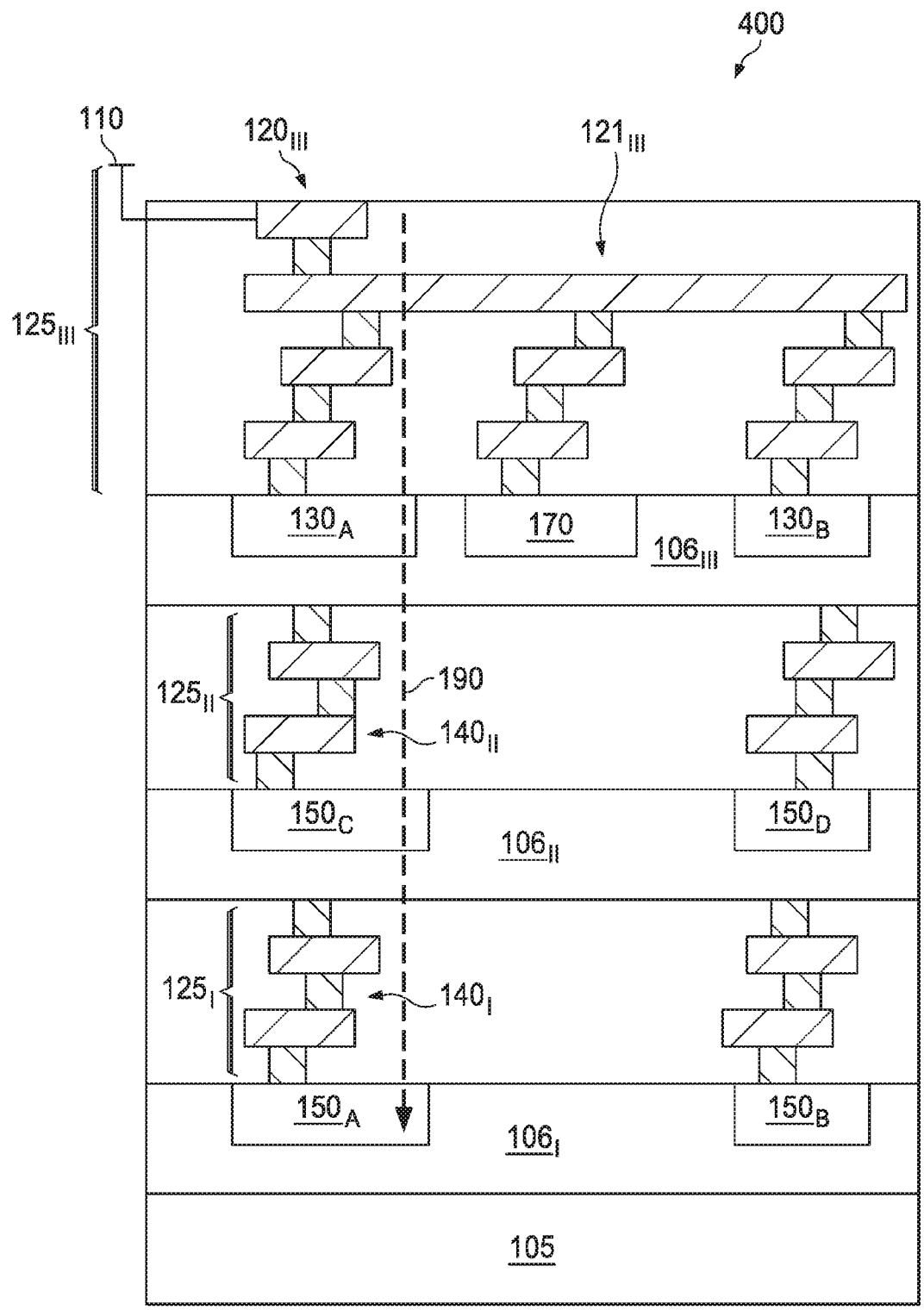
FIGS. 4 and 7 depict a graphical representation of a three dimensional integrated circuit (3DIC) structure according to one or more embodiments.

FIG. 4 depicts a graphical representation of a three dimensional integrated circuit (3DIC) structure 400 according to one or more embodiments. According to one embodiment, 3DIC structure 400 includes power gating cells ($PGC_S$) $130_A$ and $130_B$ which receive power from a true power source ($TV_{DD}$) 110 through a true power interconnect $120_{III}$. $TV_{DD}$ 110 has been described above. $PGC_S$ $130_A$ and $130_B$ are similar to PGC 130', and are formed in an active device layer $106_{III}$, which is formed over a lower interconnect structure $125_B$. True power interconnect (or $TV_{DD}$ interconnect) $120_{III}$ is similar to the true power interconnect 120 described in FIGS. 1A and 1B and is part of an interconnect structure $125_{III}$, which is formed over active device layer $106_{III}$. Interconnect structure $125_{III}$ is similar to interconnect structure 125 and $125_U$ and $125_L$ described above. $TV_{DD}$ interconnect $120_{III}$ also includes a metal line $121_{III}$, which connect to PGCS $130_A$ and $130_B$. In some embodiments, the $TV_{DD}$ interconnect $120_{III}$ is also connected to a circuit 170 ($TV_{DD}$ circuit).

Figure 7:
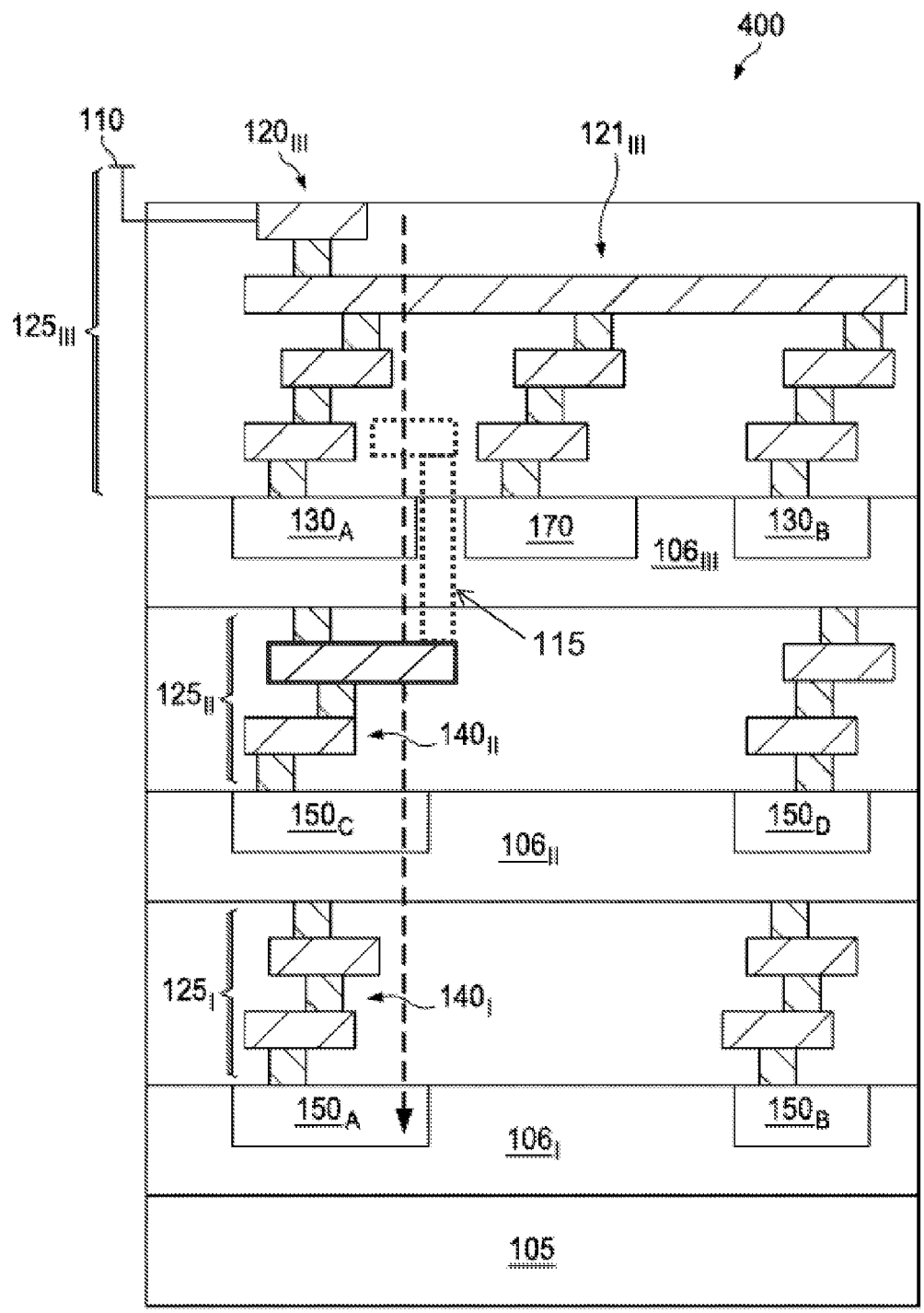

$PGC$ $130_A$ is connected to virtual power ($VV_{DD}$) circuit $150_C$ through virtual power ($VV_{DD}$) interconnect $140_{II}$, as shown in FIG. 4 in accordance with some embodiments. As described above, a conductive path (not shown, similar to conductive path 115) is formed between PGC $130_A$ and $VV_{DD}$ interconnect $140_{11}$ to provide electrical connection in some embodiments. FIG. 7 illustrates such an embodiment. Similarly, PGC $130_B$ is connected to virtual power ($VV_{DD}$) circuit $150_D$ through a virtual power ($VV_{DD}$) interconnect structure, as shown in FIG. 4 in accordance with some embodiments. A conductive path is also formed between PGC $130_B$ and $VV_{DD}$ interconnect structure. Virtual power ($VV_{DD}$) circuits $150_C$ and $150_D$ are formed in an active device layer $106_{II}$, which is formed over a lower interconnect structure $125_I$ and below interconnect structure $125_{II}$.

In some embodiments, virtual power ($VV_{DD}$) circuit $150_C$ is connected to virtual power ($VV_{DD}$) circuit $150_A$ through virtual power ($VV_{DD}$) interconnect $140_I$, as shown in FIG. 4 in accordance with some embodiments. Virtual power ($VV_{DD}$) circuit $150_D$ is connected to virtual power ($VV_{DD}$) circuit $150_E$ through a virtual power ($VV_{DD}$) interconnect structure, as shown in FIG. 4 in accordance with some embodiments. Conductive paths also formed between a $VV_{DD}$ interconnect structures and $VV_{DD}$ circuits $150_C$ and $150_D$. Virtual power ($VV_{DD}$) circuits $150_C$ and $150_D$ are formed in an active device layer $106_I$, which in turn is formed under interconnect structure $125_I$ and over substrate 105.

For low-power applications, a $TV_{DD}$ power (such as $TV_{DD}$ 110) can supply power to multiple $VV_{DD}$ circuits, such as $VV_{DD}$ circuits $150_C$, $150_D$, $150_A$ and $150_B$, via multiple PGCs, such as PGC $130_A$ and $130_B$. The $VV_{DD}$ circuits could be on formed on different active device layers. For example, $VV_{DD}$ circuits $150_C$ and $150_D$ are formed on active device layer $106_{II}$ and $VV_{DD}$ circuits $150_A$ and $150_B$ are formed on active device layer $106_I$. In addition, $TV_{DD}$ power 110 is used to power a circuit 170 ($TV_{DD}$ circuit) without going through a PGC, in some embodiments. Each of $VV_{DD}$ circuits $150_A$, $150_B$, $150_C$, and $150_D$ is connected to a ground (not shown).

Figure 5:
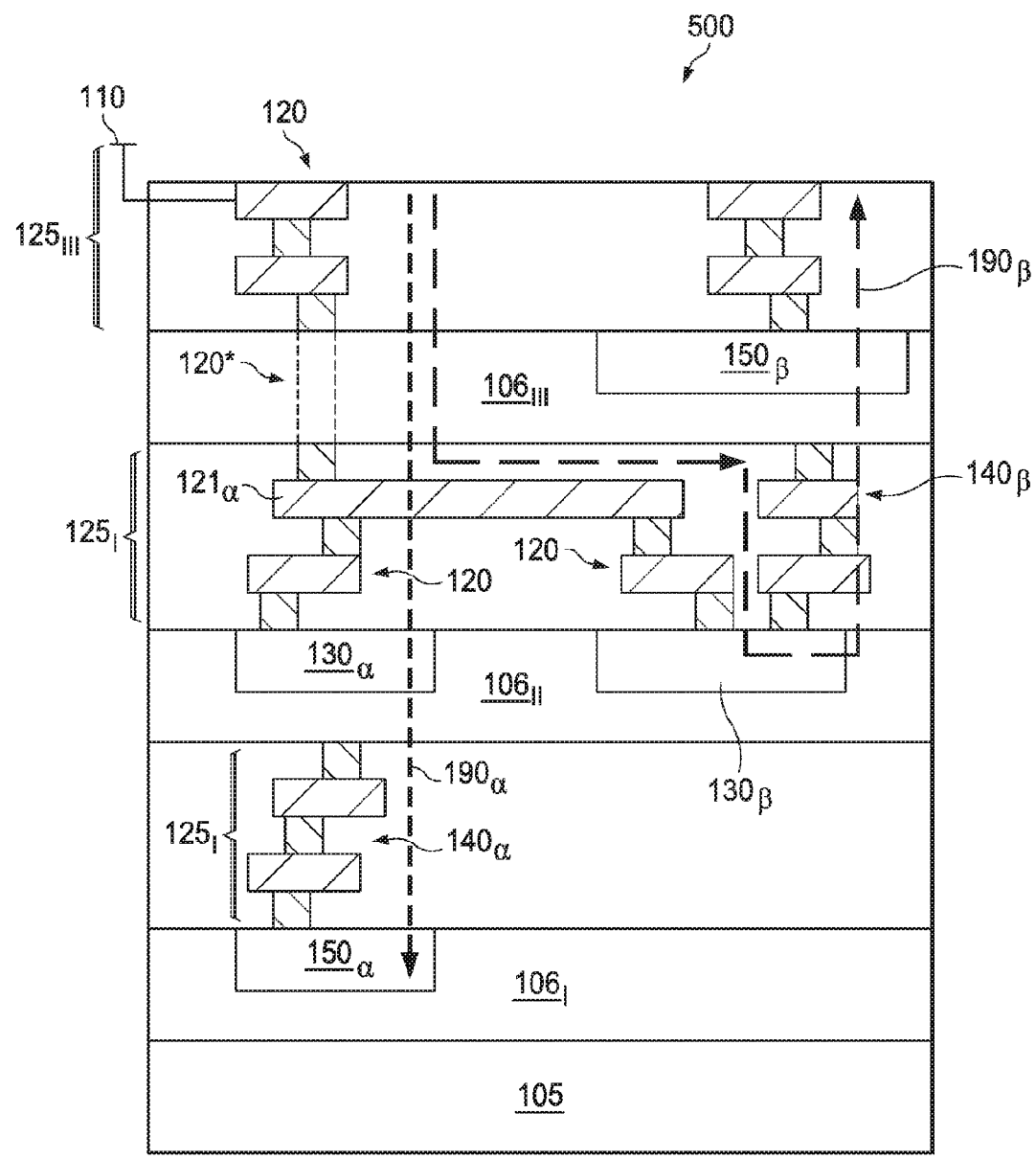
FIGS. 5 and 8 depict a graphical representation of a three dimensional integrated circuit (3DIC) structure according to one or more embodiments.
Figure 8:
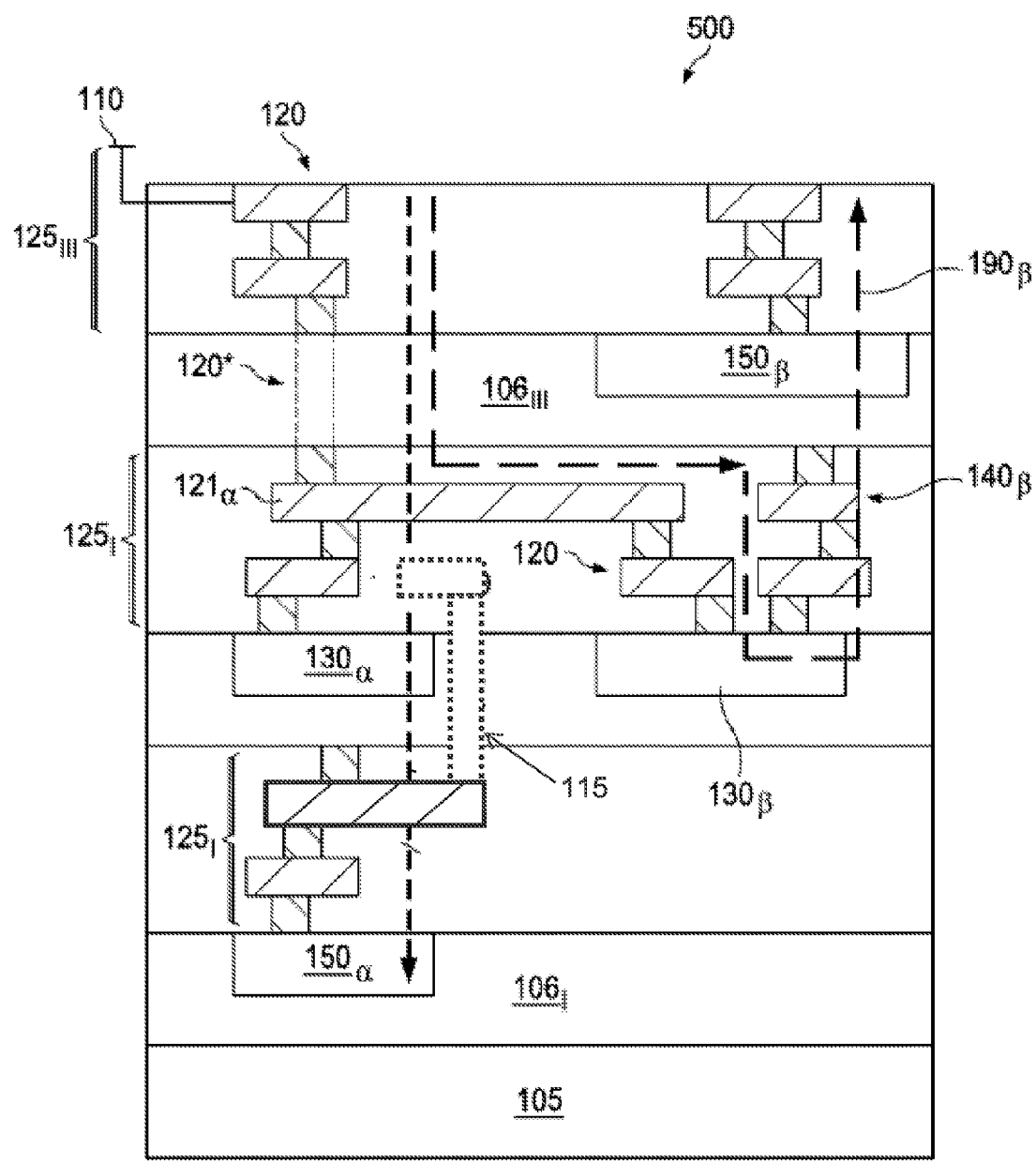

FIG. 5 depicts a graphical representation of a three dimensional integrated circuit (3DIC) structure 500 according to one or more embodiments. According to one embodiment, 3DIC structure 500 includes power gating cells ($PGC_S$) $130_\square$ and $130_\square$, which receive power from a true power source ($TV_{DD}$) 110 through a true power ($TV_{DD}$) interconnect 120. $TV_{DD}$ 110 has been described above. $PGC_S$ $130_\square$ and $130_\square$ are similar to PGC 130', and are formed in an active device layer $106_{III}$, which in turn is formed over a lower interconnect structure $125_{II}$. True power interconnect (or $TV_{DD}$ interconnect) 120 is similar to the true power interconnect 120 described in FIGS. 1A and 1B. True power interconnect 120 includes interconnect $125_{III}$ formed over an active layer $106_{III}$ and interconnect $125_{II}$ formed between active layer $106_{III}$ and active layer $106_{II}$. True power interconnect 120 also includes a conductive path 120* going through active layer $106_{III}$ to connect interconnect $125_{III}$ and interconnect $125_{II}$. As shown in FIG. 5, metal line $121_\square$ of interconnect $125_{II}$ extends and connect to both power gating cells ($PGC_S$) $130_\square$ and $130_\square$. A virtual power ($VV_{DD}$) interconnect $140_\square$ of interconnect $125_{II}$ connects PGC $130_\square$ to $VV_{DD}$ circuits $150_\square$, which is formed on active layer $106_{III}$, which is above active layer $106_{II}$. A conductive path (similar to conductive path 115) is formed between PGC $130_\square$ and $VV_{DD}$ circuit $150_\square$ to provide electrical connection, as shown in the embodiment of FIG. 8. Each of $VV_{DD}$ circuits $150_\square$, and $150_\square$ is connected to a ground (not shown).

A virtual power ($VV_{DD}$) interconnect $140_\alpha$ of interconnect $125_I$ connects PGC $130_\alpha$ to $VV_{DD}$ circuits $150_\alpha$, which is formed on active layer $106_I$, which is below active layer $106_{II}$. A conductive path (not shown, similar to conductive path 115) is formed between PGC $130_\alpha$ and $VV_{DD}$ circuit $150_\alpha$ to provide electrical connection.

FIG. 5 shows that PGCs do not need to be formed on the top active device layer. For example, PGCs $130\alpha$ and $130_b$ are formed on active device layer $106_{II}$. PGC $103\beta$ is connected to a virtual circuit $105\beta$, which is formed in an active device layer $106_{III}$, which is above active device layer $106_{II}$.

Manufacturing process flows similar to the one described in FIG. 3B may also be constructed to prepare the various embodiments of structures described in FIGS. 4 and 5. There could be 3 or more active device layers. Each active device layer has an interconnect structure over it.

The embodiments of structures and process described above in FIGS. 3A-5 are PGCs that are p-type MOSFETs.

As mentioned above in FIG. 2, the mechanisms may also apply to PGCs that are n-type MOSFETs.

Embodiments of mechanisms for forming power gating cells and virtual power circuits on multiple active device layers are described in the current disclosure. Power gating cells and virtual power circuits are formed on separate active device layers to allow interconnect structure for connecting with the power source be formed on a separate level from the interconnect structure for connecting the power gating cells and the virtual power circuits. Such separation prevents these two types of interconnect structures from competing for the same space. Routings for both types of interconnect structures become easier. As a result, metal lengths of interconnect structures are reduced and the metal widths are increased. Reduced metal lengths and increased metal widths reduce resistance, improves resistance-capacitance (RC) delay and electrical performance, and improves interconnect reliability, such as reducing electro-migration.

In some embodiments, a three dimensional integrated circuit (3DIC) structure in a semiconductor die is provided. The 3DIC structure includes a first power gating cell (PGC) formed on a first active device layer, and a first interconnect structure formed over the first active device layer. The first interconnect connects the first PGC to a power source. The 3DIC structure also includes a first virtual power circuit formed on a second active device layer, and a second interconnect structure formed between the power gating cell and the first virtual power circuit. The second interconnect structure electrically connects the first PGC and the first virtual power circuit.

In some other embodiments, a three dimensional integrated circuit (3DIC) structure in a semiconductor die is provided. The 3DIC structure includes a first power gating cell (PGC) formed on a first active device layer, and a first interconnect structure formed over the first active device layer. The first interconnect connects the first PGC to a power source. The 3DIC structure also includes a first virtual power circuit formed on a second active device layer. The first active device layer and the second active device layer are on separate levels. The 3DIC structure further includes a second interconnect structure formed between the power gating cell and the first virtual power circuit. The second interconnect structure electrically connects the first PGC and the first virtual power circuit.

In yet some other embodiments, a method of forming a three dimensional integrated circuit (3DIC) structure in a semiconductor die is provided. The method includes providing a substrate with a first active device layer, and forming at least one first virtual power circuit in a first active device layer. The method also includes forming a first interconnect structure formed over the first active device layer, and forming a second active device layer over the first interconnect structure. The method further includes forming at least one power gating cell (PGC) on a second active device layer, and forming a second interconnect structure over the second active device layer. The second interconnect structure electrically connects to a power source and the at least one PGC.

In some aspects, embodiments described herein may provide for a method of forming a three dimensional integrated circuit (3DIC) structure in a semiconductor die. The method includes providing a substrate with a first active device layer, forming at least one first virtual power circuit in the first active device layer, and forming a first interconnect structure formed over the first active device layer. The method further includes forming a second active device layer over the first interconnect structure, forming at least one power gating cell (PGC) on a second active device layer, and forming a second interconnect structure over the second active device layer; wherein the second interconnect structure electrically connects to a power source and the at least one PGC.

In other aspects, embodiments described herein may provide for a method of forming a three dimensional integrated circuit (3DIC) structure in a semiconductor die that includes forming over a substrate a first virtual power circuit in a first active device layer, and forming a power gating cell (PGC) on a second active device layer overlying the first active device layer. The method further includes forming a first interconnect structure over the first active device layer, the first interconnect structure electrically connecting the first virtual power circuit to the PGC, and forming a second interconnect structure over a second active device layer; wherein the second interconnect structure electrically connects to a power source and the PGC.

In yet other aspects, embodiments described herein may provide for a method of forming a three dimensional integrated circuit (3DIC) structure in a semiconductor die that includes forming a first power gating cell (PGC) formed on a first active device layer, and forming a first interconnect stack over the first active device layer, wherein the first interconnect stack electrically couples the first PGC to a power source. The method further includes forming a first virtual power circuit on a second active device layer, and forming a second interconnect stack between the power gating cell and the first virtual power circuit, wherein the second interconnect stack electrically couples the first PGC and the first virtual power circuit.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a three dimensional integrated circuit (3DIC) structure in a semiconductor die; comprising:
    providing a substrate with a first active device layer;
    forming at least one first virtual power circuit in the first active device layer;
    forming a first interconnect structure formed over the first active device layer;
    forming a second active device layer over the first interconnect structure;
    forming at least one power gating cell (PGC) on the second active device layer; and
    forming a second interconnect structure over the second active device layer; wherein the second interconnect structure electrically connects to a power source and the at least one PGC.

2. The method of claim 1, further comprising:
    forming a third active device layer between the first active device layer and the second active device layer;
    forming devices on the third active device layer; and
    forming a third interconnect structure over the third active device layer wherein the third interconnect structure electrically connect the devices on the third active device layer to the at least one PGC, and the second interconnect structure electrically connects the devices on the third active device layer to the at least one first virtual power circuit in a first active device layer.

3. The method of claim 2, wherein the devices on the third active device layer include at least one first virtual power circuit.

4. The method of claim 1, wherein an anneal temperature for forming devices on the second active device layer is in a range from about 400° C. to about 600° C.

5. The method of claim 1, wherein an anneal process for forming devices on the second active device layer is a microwave anneal.

6. The method of claim 1, further comprising:
    forming a conductive path in the second active device layer to electrically connect the at least one PGC on a second active device layer with the at least one first virtual power circuit in a first active device layer.

7. The method of claim 1, wherein there are multiple PGCs on the second active device layer and multiple first virtual power circuits in a first active device layer; and wherein the first interconnect structure electrically connects the multiple PGCs with the multiple first virtual power circuits.

8. The method of claim 1, wherein the step of forming a first interconnect structure includes forming a stack of metal lines and conductive vias embedded within a dielectric material.

9. A method of forming a three dimensional integrated circuit (3DIC) structure in a semiconductor die; comprising:
    forming over a substrate a first virtual power circuit in a first active device layer;
    forming a power gating cell (PGC) on a second active device layer overlying the first active device layer;
    forming a first interconnect structure over the first active device layer, the first interconnect structure electrically connecting the first virtual power circuit to the PGC;
    forming a virtual power circuit device in the second active device layer, the second active device layer being formed over the first interconnect structure, wherein forming the virtual power circuit device includes performing at least one anneal process selected from the group consisting of micro-second anneal, laser anneal, and microwave anneal; and
    forming a second interconnect structure over the second active device layer; wherein the second interconnect structure electrically connects to a power source and the PGC.

10. The method of claim 9, wherein the step of forming a first virtual power circuit in a first active device layer includes forming a PMOS transistor, an NMOS transistor, or both in the first active device layer.

11. The method of claim 9, wherein the first active device layer is formed over and in direct contact with a substrate.

12. The method of claim 9, further comprising:
forming a second power gating cell (PGC) formed on the first active device layer, wherein the first interconnect structure connects the second PGC to the PGC; and
forming a second virtual power circuit formed on the second active device layer;
wherein the second interconnect structure electrically connects the second virtual power circuit to the second PGC.

13. The method of claim 9, further comprising forming a conductive path electrically connecting the PGC to the second interconnect structure, wherein the conductive path goes through the first active device layer.

14. The method of claim 9, further comprising embedding the first interconnect structure in an extreme low-k dielectric material.

15. A method of forming a three dimensional integrated circuit (3DIC) structure in a semiconductor die, the method comprising:
forming a first active device formed in a first active device layer;
forming a first interconnect stack over the first active device layer, wherein the first interconnect stack is electrically coupled to the first active device;
forming a second active device on a second active device layer, the second active device layer being formed on the first interconnect stack;
subjecting the second active device layer to a microwave anneal step; and
forming a second interconnect stack between the first active device and the second active device, wherein the second interconnect stack is electrically coupled to the second active device and
forming in the second active device layer a power gating circuit configured to gate the flow of power to devices in the first active device layer.

16. The method of claim 15, further comprising:
forming a third active device formed in the first active device layer, wherein the first interconnect stack couples the first active device to the third active device; and
wherein the second interconnect stack is electrically coupled to the third active device.

17. The method of claim 16, further comprising:
forming a fourth active device formed on a third active device layer; and
forming a third interconnect structure formed between the third active device layer and the second active device layer.

18. The method of claim 17, wherein the first active device layer and the third active device layer are at separate levels.

\* \* \* \* \*